United States Patent [19]

Schoellikopf et al.

[11] Patent Number: 4,810,910

[45] Date of Patent: Mar. 7, 1989

[54] SENSE AMPLIFIER WITH BIT-LINE DERIVED CLOCKING

[75] Inventors: Jean-Pierre Schoellikopf, Grenoble; Yann Boyer-Chammard, Boulogne-Billancourt, both of France

[73] Assignee: Bull, S.A., Paris, France

[21] Appl. No.: 89,817

[22] Filed: Aug. 27, 1987

[30] Foreign Application Priority Data

Aug. 29, 1986 [FR] France ............... 86 12221

[51] Int. Cl.⁴ ........................... H03K 3/356
[52] U.S. Cl. .................. 307/530; 307/481; 307/497; 365/203
[58] Field of Search ........... 307/481, 496, 497, 350, 307/530, 362; 365/189–190, 203, 208

[56] References Cited

U.S. PATENT DOCUMENTS

| | | | |
|---|---|---|---|
| 4,169,233 | 9/1979 | Haraszti | 307/530 |
| 4,561,702 | 12/1985 | McAdams | 307/362 X |
| 4,606,012 | 8/1986 | Koshizuka | 365/189 |
| 4,723,228 | 2/1988 | Shah et al. | 365/189 X |

FOREIGN PATENT DOCUMENTS

| | | |
|---|---|---|
| 0143591 | 5/1985 | European Pat. Off. . |
| 0175880 | 2/1986 | Japan . |
| 0185451 | 6/1986 | Japan . |
| 2070372 | 3/1981 | United Kingdom . |

Primary Examiner—David Hudspeth
Attorney, Agent, or Firm—Kerkam, Stowell, Kondracki & Clarke

[57] ABSTRACT

A sense amplifier device, as of CMOS technology includes a first (AN) and second (AP) amplifier responsive to the voltages (VB0, VB1) of two bit lines (B0, B1) to be amplified. When it is activated, the first amplifier (AN) connects the bit line having the lowest potential to ground potential. When the voltage of one of the bit lines is lower than a threshold voltage (VT), the second amplifier is triggered and connects the bit line having the highest potential to supply voltage.

20 Claims, 5 Drawing Sheets

SENSE AMPLIFIER WITH BIT-LINE DERIVED CLOCKING

FIELD OF THE INVENTION

The present invention relates to an amplifier device, such as a sense or reading amplifier, which serves to amplify the voltage difference appearing between two lines that represent one data bit. Such amplifiers also serve to stabilize the voltage levels of two bit lines. The bit lines may be the output lines of a memory cell furnishing voltage levels that require amplification. The reading amplifier according to the invention is equally applicable to static and dynamic memory cells. The bit lines can also be connected to the output lines of a logic circuit that is part of an operator, belonging for example to a central processing unit of a computer.

BACKGROUND OF THE INVENTION

The amplifier according to the invention is particularly well adapted to amplify output signals of circuits produced by CMOS technology.

Reading amplifiers must keep two bit lines at predetermined, stable voltage levels representing a corresponding binary value. Typically, one of these levels corresponds to the ground voltage of the circuit, while the other level is that of a source of supply voltage. In such arrangements, reading amplifiers must meet a constraint having to do with the speed of operation, on the one hand, and on the other they must be designed to consume as little power as possible.

U.S. Pat. No. 4,551,641 describes a CMOS amplifier device comprising a first amplifier made with the aid of cross-connected NMOS transistors, which under the influence of a control signal effects the connection to ground of the bit line having the voltage that is closest to the ground voltage. Under the influence of a second control signal, a second amplifier using cross-connected PMOS transistors has the effect of putting the second bit line in communication with the supply source. The control signals of the two amplifiers are clock signals, phase shifted with respect to one another.

While the aforementioned circuit does attain amplification of the bit lines, it necessitates the presence of two clock signals, with a phase shift that must be sufficient to activate the second amplifier once the first bit line has been discharged sufficiently. If the amplifier having PMOS transistors is triggered too soon, before the first bit line has been discharged sufficiently, the two amplifiers would create a short-circuit path between the supply source and ground. This is a major disadvantage, especially in the case where a plurality of amplification devices are used to amplify the output of a register or operator including a large number of bit lines, each pair of bit lines being connected to such an amplification device controlled by the signals originating in a single clock.

In an application as just described, all the amplifiers with PMOS transistors are activated simultaneously, and accordingly a sufficiently great delay must be provided between this activation and that of the amplifiers with NMOS transistors, to prevent the aforementioned short circuit of any pair of bit lines. Moreover, this delay must also take into account the dispersion in the properties of the circuits that is inherent in their manufacture. The phase displacement between the activations of the two amplifiers must be exaggerated, which necessarily makes the amplification function slower. Otherwise, there is an increased risk of creating short-circuit paths between the supply and the ground, hence increasing power consumption.

OBJECT AND SUMMARY OF THE INVENTION

The object of the invention is to overcome these disadvantages, and to this end an amplification device is proposed in which the second amplifier is controlled not by a clock signal, but by a signal derived from the state of the voltages on the bit lines.

More precisely, the subject of the invention is a device for amplifying the difference in voltage between two bit lines, said device being associated with a source of supply voltage and including a first amplifier sensitive to the voltages of said bit lines and which, when it is activated by a control signal, puts the bit line having the lowest voltage in communication with the terminal having the lowest potential of said voltage source, and a detection circuit furnishing an output signal when the voltage of one of the bit lines is lower than a predetermined value and a second amplifier the activation of which is controlled by said output signal and which is sensitive to said voltages which when it is activated puts the bit line having the highest voltage in communication with the terminal having the highest potential of said supply source.

The invention also proposes an embodiment using CMOS technology.

Another feature of the invention relates to a device enabling slaving of the activation of the first amplifier to the signals for selection of the memory cell or the operator, the output of which is amplified by devices according to the invention.

In yet another feature, the amplification device according to the invention is associated with a circuit permitting precharging of the bit lines slaved to the end of the activation of the first amplifier.

BRIEF DESCRIPTION OF THE DRAWINGS

Other characteristics and details of embodiment will become apparent from the ensuing description of a preferred embodiment.

DESCRIPTION OF THE PREFERRED EMBODIMENTS

Figure 1:
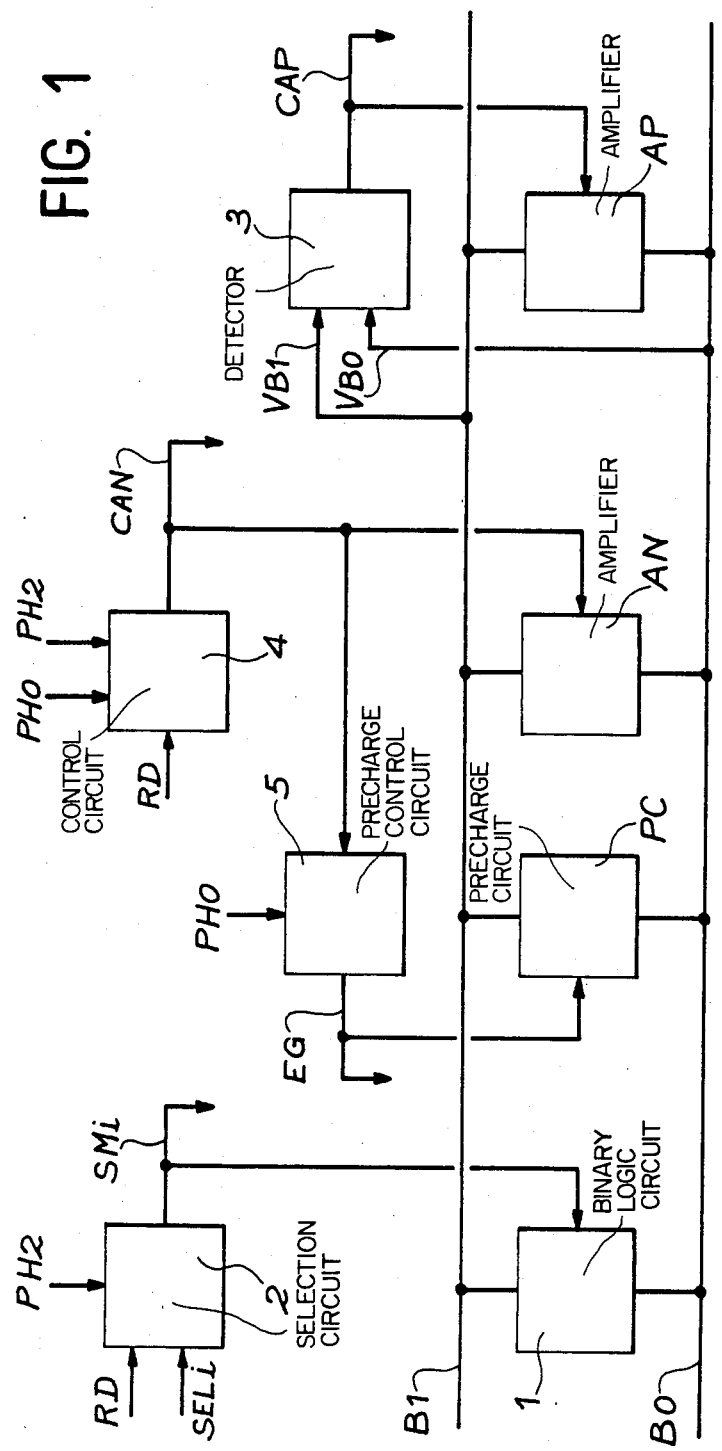
FIG. 1 is a schematic illustration of an amplification device according to the invention.

FIG. 1 shows in block diagram form the essential elements comprising the amplification device and also shows how the device cooperates with a memory point or a binary logic circuit. As shown in FIG. 1, the bit lines B0, B1 are connected to the output terminals of a binary unit 1, which is for example a multivibrator which form part of a register. The binary unit 1 may also be the output circuit associated with one bit of a digital operator. For the sake of simplification, the binary unit is hereinafter called simply a "memory point".

The memory point 1 is selected by the signal SMi emitted by a selection circuit 2 receiving a read control signal RD, a clock signal PH2 and optionally a register selection signal SELi, which is used if the memory point 1 is a multivibrator of to a register bank. In the case where the register i of the bank is selected, the signal SELi becomes active, which selects all the multivibrators of the register i via the signal SMi. The selection is effective only under the control of the reading signal RD and during the reading phase imposed by the clock signal PH2. It is not particularly difficult to embody the selection circuit 2. It is advantageously embodied in the usual manner with the aid of logic gates using CMOS technology.

The memory point 1 and the selection circuit 2 are mentioned in order to show the context of the amplification device according to the invention. The amplification device per se comprises a first amplifier AN, connected to the bit lines B0, B1 and activated by a control signal CAN. The amplification of the amplifier AN has the effect of discharging the bit line B0 or B1 having the lowest potential. For example, if the circuit operates between the voltages of 0 and 5 volts, then the amplifier AN will put the line having the lowest potential in communication with the ground.

The control signal CAN is generated by the control circuit 4 in response to the reading control signal RD during the reading phase determined by the clock signal PH2.

A second amplifier AP is likewise connected to the bit lines B0, B1 and receives the control signal CAP. When it is activated, this amplifier AP has the effect of charging the line having the highest potential. For example, if the supply voltage is 5 volts, the line having the highest potential will be charged to 5 volts by the amplifier AP.

The control signal CAP of the second amplifier AP is furnished by a detection circuit 3, the inputs of which are connected to the two bit lines B0, B1. The detector 3 activates the signal CAP when one of the voltages VB0, VB1 of the bit lines B0, B1 is below a predetermined voltage threshold. Thus by means of the detector 3, the second amplifier AP is automatically triggered; that is, it is triggered automatically when the first amplifier has operated enough to discharge the bit line having the lowest potential. Staggered triggering of the two amplifiers AN, AP is indispensable, to guarantee stable amplification of the relatively slight voltage difference initially present between the two bit lines.

The amplification device also includes a standard precharging circuit PC intended for precharging the two bit lines to a predetermined voltage prior to the selection of the memory point for reading it. The precharging circuit PC is actuated by the control signal EG emitted by a precharging control circuit 5. This precharging control circuit receives the control signal CAN of the first amplifier AN. This circuit also receives the clock signal PH0, which determines the phase of the precharging. The clock signal PH0 is also applied to the control circuit 4 of the first amplifier AN and its effect is to deactivate the control signal CAN of the first amplifier AN. The role of the precharging control circuit 5 is to slave the activation of the precharging to the signal CAN such that the precharging control circuit is active only after the control signal of the amplifier AN has disappeared.

The operation of the device of FIG. 1 is as follows: It is assumed that the circuits are supplied via a source of positive voltage, of 5 volts, for example. As soon as the signal PH0 appears, the signal CAN is set to zero by the circuit 4. As soon as the signal CAN is at zero, the circuit 5 furnishes the precharging control signal EG, which activates the precharging circuit PC. The bit lines B0, B1 are then charged to the same precharging voltage. During the reading phase defined by the signal PH2, if the signals RD and SELi are applied to the selection control circuit 2, the memory point 1 is selected via the signal SMi. As a function of the binary value memorized in the memory point 1, one of the bit lines assumes a voltage higher than the voltage of the other bit line. On the other hand, the control circuit 4 causes the activation of the first amplifier AN. The result is a discharging of the bit line that had the lowest voltage. When the voltage of that line drops below a threshold value, this state is detected by the circuit 3, which then activates the second amplifier AP. The bit line having the higher voltage is then charged to the supply voltage by the second amplifier. Thus because of the joint action of the two amplifiers, one of the bit lines will have zero voltage, while the other bit line will be brought to the supply voltage. This state continues until the appearance of a new precharging phase PH0.

While remaining within the scope of the invention, it is equally possible for the roles of the two amplifiers AP and AN to be switched. In this variant, the amplifier AP is activated first by the signal CAN. When the voltage of the line having the highest potential exceeds a threshold voltage, the detector then activates the amplifier AN.

Figure 2:
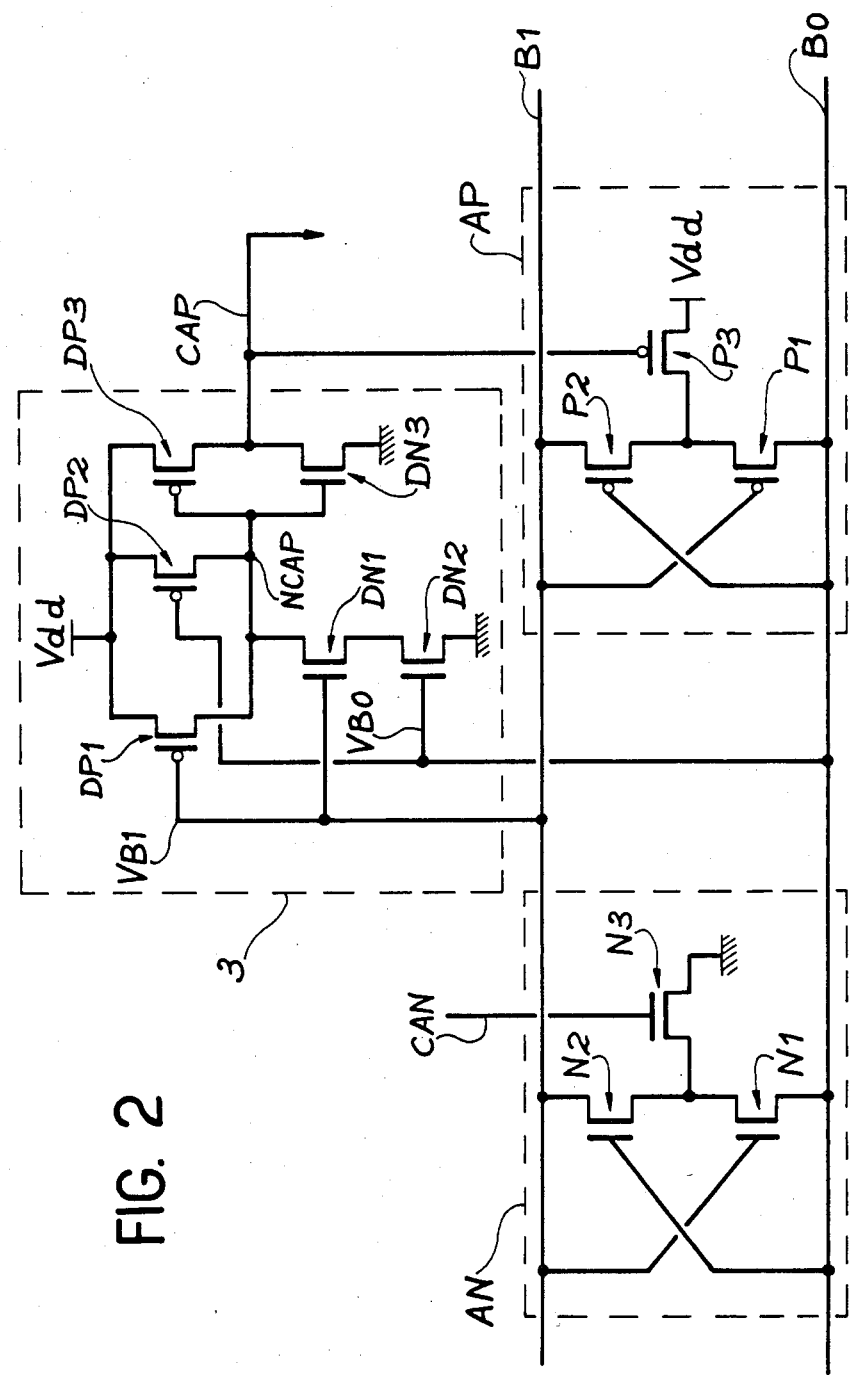
FIG. 2 shows an embodiment using CMOS technology for the amplification and automatic triggering circuits of the amplification device according to the invention.

FIG. 2 shows a detailed embodiment of the first amplifier AN, the second amplifier AP and the detector 3 that controls it, each being defined within the boundaries of their respective rectangular block formed by dash lines. The circuits are embodied with field-effect transistors, such as MOS transistors. More precisely, the embodiment is attained by CMOS technology. By convention, PMOS transistors are distinguished from NMOS transistors by a small circle on their gate electrode.

The two amplifiers AN and AP are assembled in the standard manner. The first amplifier AN is embodied by means of three NMOS transistors. A first transistor N1 has its drain connected to one of the bit lines B0; a second transistor N2 has its drain connected to the other bit line B1; and the sources of the two transistors N1, N2 are connected to the drain of a third transistor N3, the source of which is connected to ground. The gate of the first transistor is connected to the second bit line B1, while the gate of the second transistor is connected to the first bit line B0. The gate of the third transistor N3 receives the control signal CAN. The second amplifier AP uses analogously assembled PMOS transistors. A first transistor P1 has its drain connected to the first bit line B0; a second transistor P2 has its drain connected to the first bit line B0; the sources of these two transistors P1, P2 are connected to the drain of a third transistor P3, the source of which is connected to the supply voltage Vdd. The third transistor P3 receives the control signal CAP at its gate.

The detector 3 comprises a logical AND gate embodied by CMOS technology. To embody an AND gate, a CMOS "NOT-AND" gate is used, followed by a CMOS inverter. As shown in FIG. 2, the "NOT-AND" gate comprises the four transistors DP1, DP2, DN1, DN2 assembled in the standard manner. Two PMOS transistors DP1, DP2 are connected in parallel, with their sources connected to the positive supply voltage Vdd. Two NMOS transistors DN1, DN2 are connected in series, with the drain of the transistor DN1 connected to the drains of the transistors DP1 and DP2 and the source of the transistor DN2 connected to ground. The gates of the transistors DN1 and DP1 are connected to the line B1, while the gates of the transistors DN2 and DP2 are connected to the line 80. The inverter is embodied by the two complementary transistors DP3, DN3, assembled in a standard manner.

The operation of the circuit of FIG. 1 is as follows: Assuming that at the moment of control of the first amplifier AN, the voltage on bit line B0 is lower than that on bit line B1, the n-channel transistor N1 is more conductive than the transistor N2. As a result, the voltage on bit line B0 decreases more rapidly than that on line B1. When the voltage on line B0 is lower than the threshold voltage of the n-channel transistor DN2 of the detector 3, the latter transistor is blocked. Also, the voltage on line B0, applied to the gate of the complementary transistor DP2, puts that transistor in the ON state. The drain voltage NCAP of this transistor then increases to the supply voltage Vdd. As a result, the output voltage CAP of the inverter DP3, DN3 decreases to zero. The p-channel transistor P3 of the amplifier AP then becomes conductive, and given the voltage difference present between the bit lines B0, B1, the p-channel transistor P2 becomes conductive, while the second p-channel transistor P1 becomes less conductive. The voltage VB1 on bit line B1 will then increase to the supply voltage Vdd. Simultaneously, the p-channel transistor P1 will become less and less conductive. Finally, the bit line B1 will be charged to the supply voltage Vdd, while the bit line B0 will be completely discharged.

An analogous operation is obtained if it is hypothesized that the voltage on bit line B1 is lower than on bit line B0. In this latter instance the p-channel transistor DP1 of the detector 3 becomes conductive when the voltage VB1 on bit line B1 is less than the threshold voltage of this transistor. Likewise, the n-channel transistor DN1 will be blocked. As above, the result is the activation of the second amplifier AP. Finally, the voltage VB1 becomes zero and the voltage VB0 becomes equal to the supply voltage Vdd.

To the extent that the function of the amplifiers AN and AP would not be fundamentally changed, they can be embodied with minor modifications for purely technological reasons. In particular, the transistor N3 can be replaced by two n-type transistors in parallel. Similarly, the sources of the transistors P1 and P2 can be connected separately to the voltage source, by way of two respective p-type transistors controlled by the same signal CAP.

Figure 3:
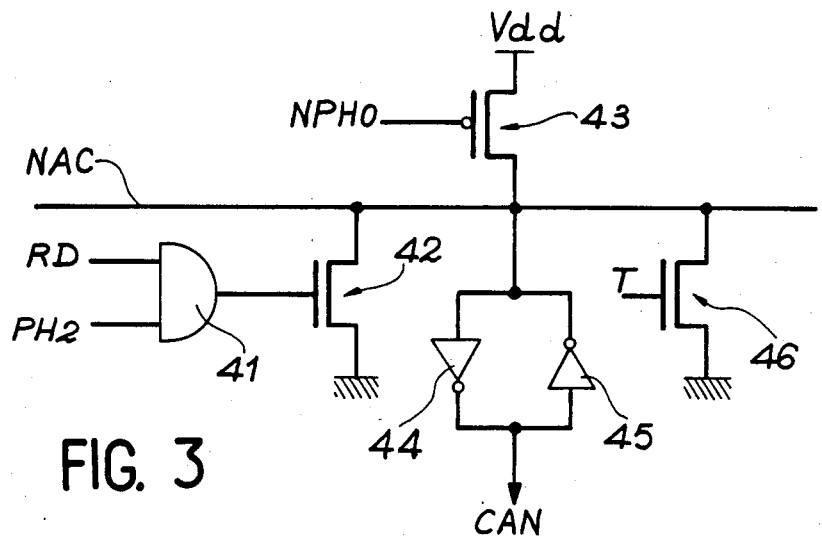
FIG. 3 shows an embodiment of a triggering circuit of the amplification device according to the invention.

FIG. 3 shows an embodiment of the control circuit 4 of the first amplifier AN. This circuit includes and AND gate 41 that receives the reading control signal RD and the clock signal PH2 controlling the reading phase. The output of the AND gate 41 is connected to the gate of an NMOS transistor 42, the source of which is connected to ground and the drain of which is connected to a line NAC. This line NAC is connected to the input of a multivibrator comprising two CMOS inverters 44, 45 disposed, i.e, in parallel and input-to-output relationship. The output of this multivibrator furnishes the control signal CAN of the first amplifier AN. The line NAC is also connected to the drain of a PMOS transistor 43, the source of which is connected to the supply voltage Vdd and the gate of which receives the signal NPH0. The line NAC can also be connected to the drain of one or more NMOS transistors NMOS, the gate of which receives a signal T.

This control circuit operates as follows: During the precharging phase, the clock signal PH0 is active, and its complementary signal NPH0, applied to the gate of the transistor 43, makes this transistor conductive. As a result, the line NAC charges to the supply voltage Vdd. The output of the multivibrator 44, 45 then assumes the value of logical 0, corresponding to a zero voltage, and the first amplifier AN has not been activated. During the reading phase, the clock signal PH2 is active. If the signal RD is active at the same time, the output signal of the AND gate 41 makes the transistor 41 conductive, which discharges the line NAC. As a result, the multivibrator 44, 45 changes state, and its output signal CAN assumes the value of logical 1, corresponding to the voltage Vdd, thus activating the first amplifier AN.

The switching of the transistor 42, the discharging of the line NAC and the change in state of the multivibrator 44, 45 necessitate a certain delay, with the effect that the activation of the first amplifier is retarded with respect to the appearance of the clock signal PH2. Thus the amplifier AN will be activated a certain time after the selection of the memory point 1, which allows sufficient time for the bit lines B0, B1 to have a difference in voltage, which permits correct functioning of the first amplifier AN.

The transistor 46 is provided in order to permit activation of the amplifiers AN in cases other than that of reading. This may be useful if it is desired to use the bit lines B0, B1 simply as transfer lines, without selection of a memory point associated with these lines.

Figure 4:
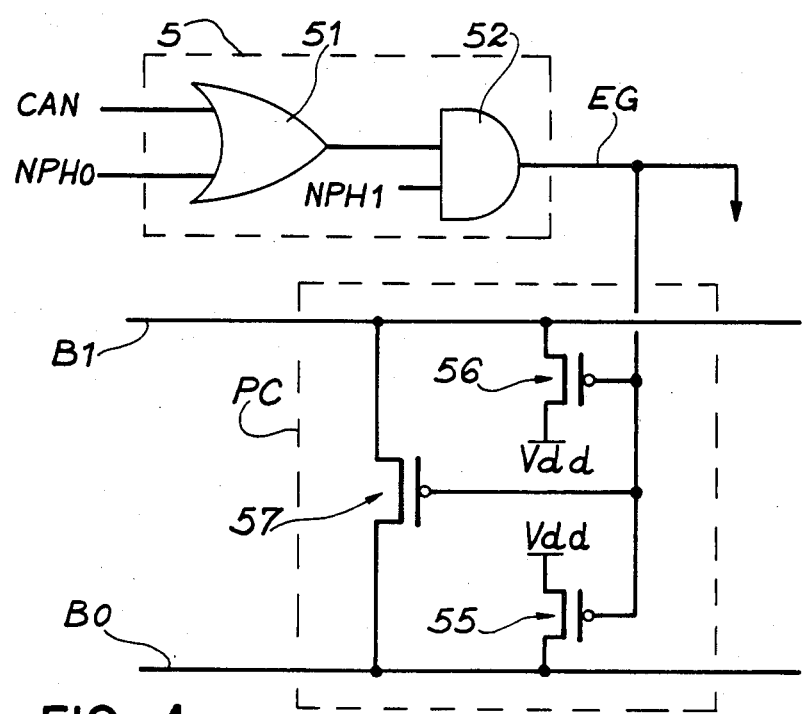
FIG. 4 shows a circuit for precharging the bit lines belonging to the amplification device according to the invention.

FIG. 4 shows an embodiment of a device permitting the precharging of the bit lines B0, B1. This device comprises the precharging circuit PC itself and a control circuit 5. The precharging circuit PC comprises three p-channel field-effect transistors 55, 56, 57. The two transistors 55 and 56 have their source connected to a terminal for the supply of positive voltage, for example Vdd. The drains of the transistors 55 and 56 are connected respectively to the two bit lines B0, B1. The third transistor 57 has its current electrodes connected to the two bit lines B0, B1. At their gate, the three transistors 55, 56 and 57 receive the signal EG emitted by the control circuit 5.

The function of the precharging circuit PC is quite simple. When the signal EG assumes the value of logical 1, corresponding to the voltage Vdd, the three transistors 55, 56, 57 are blocked. When the signal EG assumes the value of logical 0, the three transistors conduct. As a result, the bit lines B0, B1 are charged to the supply voltage Vdd, with the transistor 57 guaranteeing an equalization of the voltage on the two lines.

The precharging of the bit lines B0 and B1 must not take place when the first amplifier AN is still active, because this would create a short-circuit path between the positive voltage Vdd and ground, via one of the transistors 55 or 56 of the precharging circuit PC and one of the transistors N1 or N2 in the ON state of the first amplifier AN. To this end, the precharging control circuit 5 includes an OR gate 51 which at its two inputs receives the signal CAN and the signal NPH0 complementary to the clock signal PH0 that serves to trigger the precharging phase. The output of the OR gate 51 is connected to one of the two inputs of an AND gate 52, the other input of which receives the complementary signal NPH1 of another clock signal PH1 succeeding the signal PH0. The output of the AND gate 52 furnishes the signal EG that is applied to the gates of the transistors of the precharging circuit PC.

The control circuit 5 thus permits the activation of the precharging circuit PC when the clock signal PH0 is active, but on the sole condition that the signal CAN is already inactive. This device accordingly permits triggering of the precharging as soon as possible at the beginning of the precharging phase PH0, while taking into account the delay for deactivation of the signal CAN brought about by the response times of the transistor 43 and of the multivibrator 44, 45 described in connection with FIG. 3.

The AND gate 52 which receives the signal NPH1 has been mentioned in order to address the case where the amplification device is used in a central processing unit of a computer that operates in four clock phases. More precisely, the first clock phase PH0 corresponds to a phase of deactivation of the data track amplifiers and to the precharging of the control line NAC mentioned in connection with FIG. 3. The phase PH1 is a phase dedicated to the precharging of the data track bit lines. The phase PH2 activates the selection of the memory points or digital operators. Finally, a fourth phase PH3 corresponds to a phase of amplification of the output signals of these memory points or of these logic circuits.

It should be noted that the data lines can be precharged to voltages lower than the positive voltage Vdd of the supply source. The precharging circuit can even be simplified by retaining only the single equalizing transistor 57, because the selection of a memory point for reading is always followed by a charge to the positive supply voltage of one of the bit lines. The activation of the signal equalizing transistor 57 after such precharging would place each of the bit lines at a voltage of one-half of the supply voltage.

Figure 5:
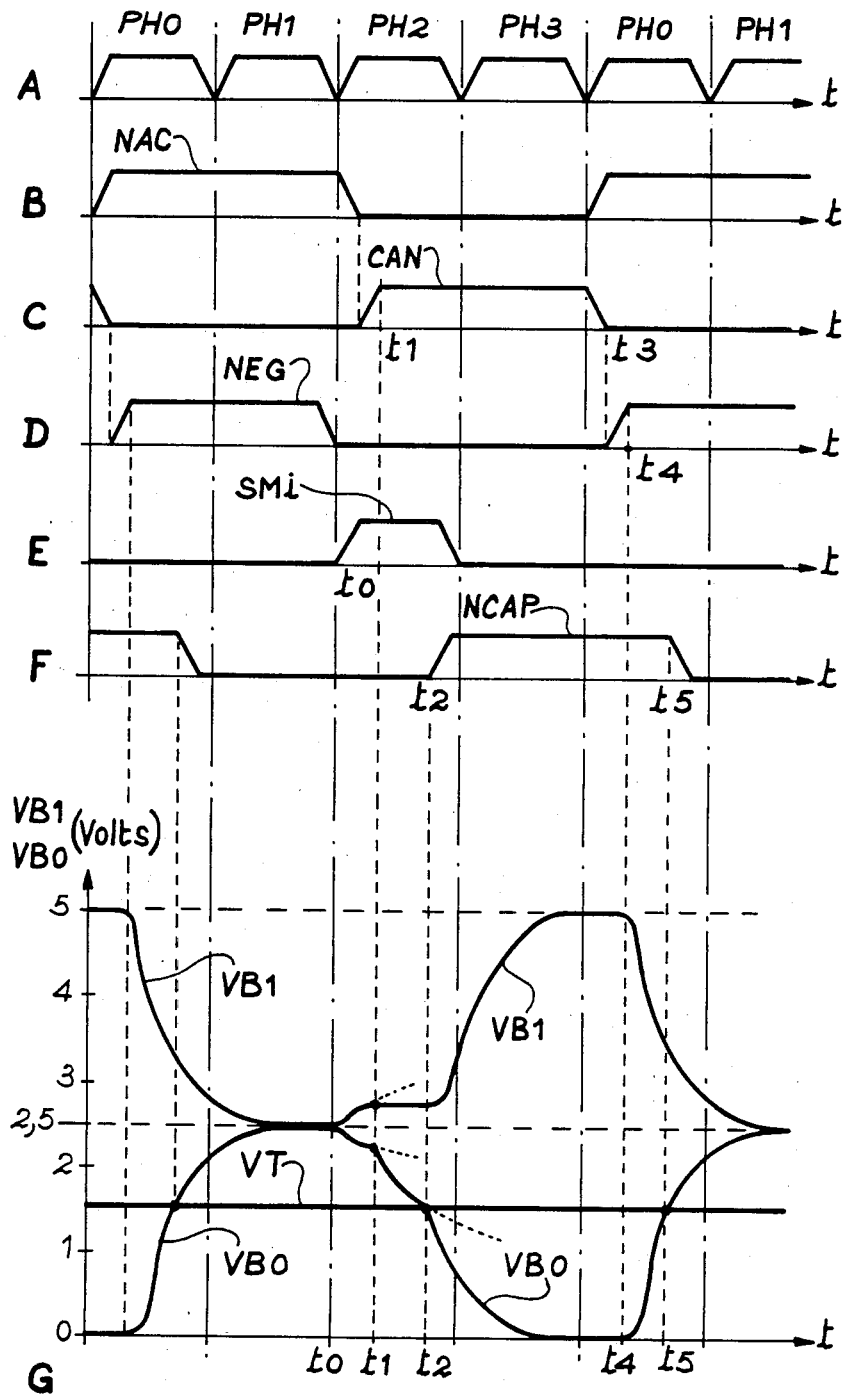
FIGS. 5 and 6 are timing diagrams explaining the function of two variant embodiments of the amplification device according to the invention.
Figure 6:
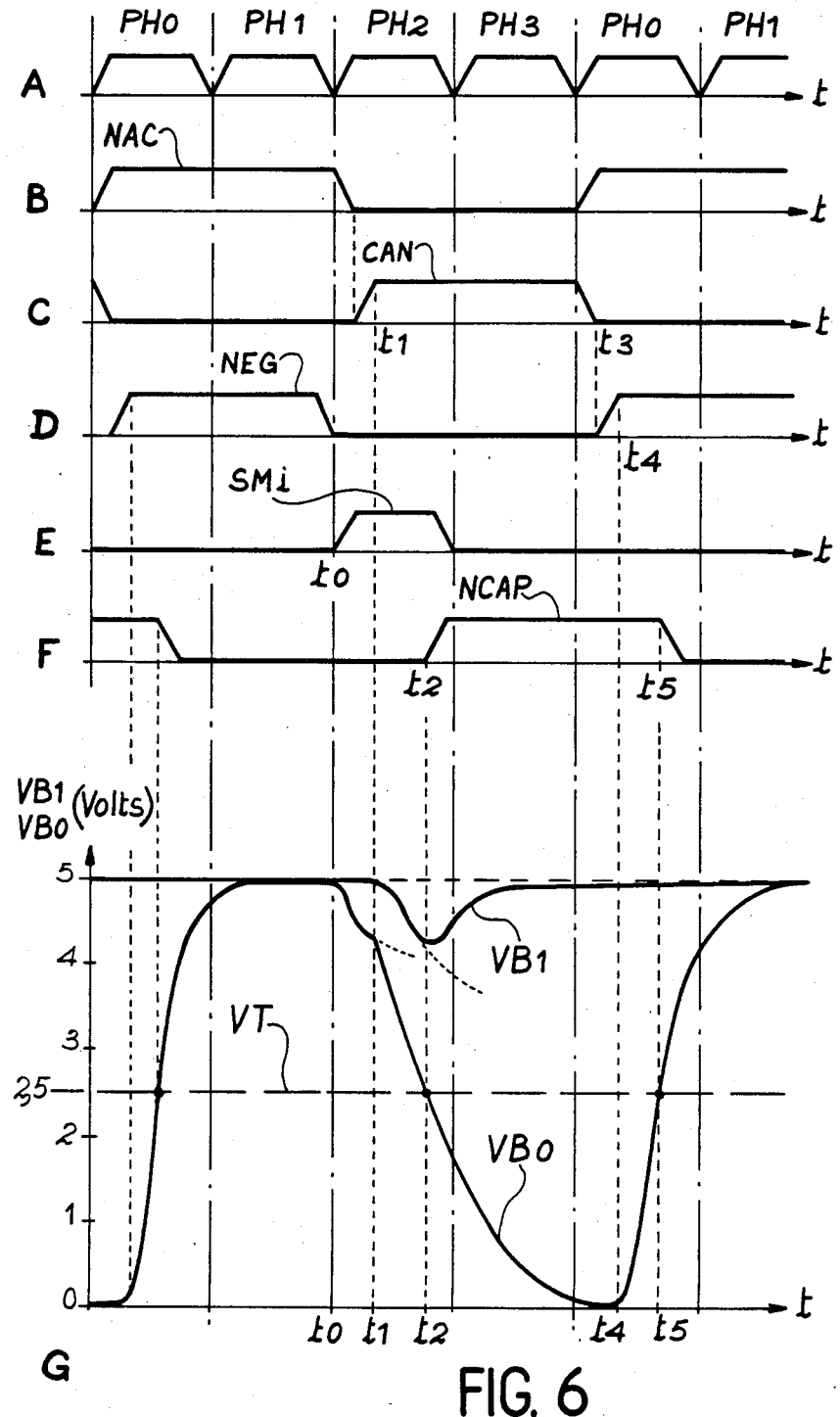

The timing diagrams provided in FIGS. 5 and 6 will permit detailed explanation of the function of the amplification device according to the invention, in two variant embodiments of the precharging circuit.

The timing diagrams A–G of FIG. 5 show variations as a function of time of the various signals that have already been mentioned above.

The timing diagram A shows the four clock phases PH0, PH1, PH2, PH3 involved in the function of a central processing unit of a computer. The timing diagram B shows the signal present on the line NAC described in FIG. 3. The timing diagram C shows the signal CAN emitted by the multivibrator 44, 45. The timing diagram D shows the complementary signal NEG of the precharging control signal GG. The timing diagram E shows the signal SMi for selection of a memory point connected to the bit lines. The timing diagram F shows the complementary signal NCAP of the control signal CAP emitted by the detector 3 shown in FIGS. 1 and 2. Finally, the timing diagram G shows the variations of the voltages VB0 and VB1 present on the bit lines B0 and B1, respectively, as a function of time.

The variant embodiment corresponding to the function shown in FIG. 5 corresponds to the case where the precharging circuit is made up simply of one equalizing transistor.

A short time prior to the appearance of phase PH2, at time t0, the bit lines B0, B1 are precharged to a constant value equal to one-half the supply voltage Bdd. In the timing diagram G, it has been assumed that this voltage Vdd equals 5 volts. After time t0, since the signal PH2 becomes active, the selection control circuit 2 furnishes the signal SMi to the selection input for the memory point 1. This signal causes circuits for memorization of the memory point 1 to be put in communication with the bit lines B0, B1. As a result, the voltage of one of the bit lines will increase, and that of the other bit line will decrease. In the timing diagram G, it has been assumed that the voltage VB1 increases while the voltage VB0 decreases, indicating a memorized value of logical 1.

Also, upon the appearance of the clock signal PH2, the transistor 42 of the circuit of FIG. 3 becomes conductive, causing the discharging of the line NAC. As a result, the output CAN of the multivibrator 44, 45 changes to the value of logical 1 at time t1, some time after time t0. The signal CAN then, at time t1, activates the first amplifier AN, causing the accelerated discharging of the bit line B0 via the transistor N1.

Since the second transistor N2 is now blocked, or at least is less conductive than the first transistor N1, the voltage VB1 of the line B1 remains constant or decreases less quickly than that of the line B0. When the voltage VB0, at time t2, reaches the threshold value VT for triggering the detector 3, the detector 3 furnishes a signal CAP that activates the second amplifier AP. As a result, the transistor p2 of the second amplifier AP becomes conductive. The line B1 is then charged to the supply voltage Vdd via the transistors P3 and P2. Thus, beginning at time t2, the voltage VB1 increases rapidly up to the supply voltage Vdd. Simultaneously, the voltage VB0 continues to decrease to zero. This amplification continues during the entire phase PH3, until the following phase PH0. The signal PH0 then makes the transistor 43 of FIG. 3 conductive, thus causing the precharging of the line NAC to the supply voltage. The multivibrator 44, 45 then changes its state, and the signal CAN assumes the value of 0 at time t3. The output signal EG of the equalization control circuit 5 then assumes the value 0 at time t4. The result is the activation of the equalizing transistor 57 of the precharging circuit PC, and the line B1 discharges while the line B0 charges up to a common value equal to approximately one-half the supply voltage. This equalization continues during the entire ensuing phase PH1.

It is of interest to note that the second amplifier AP contributes to the precharging between times t4 and t5, which is made possible precisely by the slaving of its triggering to the voltage of the bit lines, rather than to an external clock signal.

From the above-described function, it can be confirmed that the two amplifiers AN and AP operate symmetrically. Thus if these amplifiers are embodied by MOS technology, p-channel transistors of equally high performance as the n-channel transistors must be provided, to comprise the two amplifiers AN and AP. However, p-channel MOS transistors of equal performance to n-channel MOS transistors are much larger in volume. It is accordingly desirable to design a device with a view to these technological constraints. Hence it is more advantageous to make the amplifier AN work more than the amplifier AP, because then lower-performance p-channel transistors can be used. To do so, and according to another characteristic of the invention, the bit lines are no longer precharged to a voltage one-half the supply voltage Vdd, but instead to the voltage Vdd itself. The precharging circuit PC described in connection with FIG. 4 permits this precharging to the supply voltage.

The timing diagrams of FIG. 6 enable an explanation of the function of the amplifier device in this latter situation. The timing diagrams A-G have the same meaning as those of FIG. 5. The function is as follows: As in the case of FIG. 5, in the course of phase PH2, at time t1, the first amplifier AN is activated. As above, the line B0 discharges via the transistors N1 and N3. Taking into account the precharging to the supply voltage Vdd, the other line B1 also discharges, but less rapidly than the line B0. When the voltage VB0 reaches the threshold VT, the amplifier AP is activated and the line B1 is recharged to the supply voltage Vdd via the transistors P2 and P3 of the second amplifier AP. Finally, the line B1 is charged to the voltage, and the line B0 assumes the ground voltage. As above, at time t4 of phase PH0, the precharging signal EG activates the precharging circuit PC. The line B1 then remains at the supply voltage, while the line B0 is charged to this same voltage. Once again, in this variant, the second amplifier AP contributes to the precharging.

As confirmed by the course of the curves VB1 and VB0 of the timing diagram G in FIG. 6, and contrary to the foregoing variant, the first amplifier AN works much more than the second amplifier AP during the reading phase. The amplifier AP now has only an auxiliary role, which permits the use of a much less powerful PMOS transistor than in the case of precharging to a voltage lower than the supply voltage. Conversely, the precharging PC requires more energy. However, this does not impinge on the universal performance of the circuit, the most important parameter of which is the rapidity which the memorized values are read and amplified.

The above explanation shows that the invention is particularly well adapted to an embodiment totally achieved by CMOS or an analogous technology. It will be understood that obvious modifications of the invention can be made. In particular, it is possible to use supply sources having negative voltage, or to replace any transistor with a plurality of transistors of the same type, connected in parallel.

We claim:

1. A device for amplifying the difference in voltage between two bit lines, said device being connectable to receive a source of supply voltage and including a first amplifier responsive to the voltages of said bit lines and which, when it is activated by a control signal, couples the bit line having the lowest voltage to a terminal of the voltage source having the lowest potential of said voltage source, said device including a detection circuit connected to the bit lines and furnishing an output signal when the voltage of one of the bit lines is lower than a predetermined value, and said output signal controls the activation of a second amplifier responsive to said voltages and which when it is activated couples the bit line having the highest voltage to another terminal of the voltage source having the highest potential of said voltage source.

2. A device according to claim 1, wherein the detection circuit comprises an AND gate having two inputs connected respectively to the two bit lines.

3. A device according to claim 2, wherein the first amplifier and the second amplifier each comprise a first field-effect transistor and a second field-effect transistor, drains of said first and second transistors being connected to the first and second bit lines, respectively, sources of said first and second transistors being connected to a drain of a third field-effect transistor, the first amplifier comprising n-channel transistors, and the third transistor of said first amplifier having a source connected to the supply voltage terminal having the lowest potential, the second amplifier comprising p-channel transistors, a third transistor of said second amplifier having a source connected to the supply voltage terminal having the highest potential, and a gate of said third transistor of the second amplifier being connected to an output of the detection circuit.

4. A device according to claim 3, wherein the transistors comprising the first and the second amplifier are MOS transistors, and the detection device comprises a CMOS NOT-AND gate having an output which is connected to an input of a CMOS inverter, an output of said inverter being connected to the gate of the third transistors of said second amplifier.

5. A device according to claim 4, wherein the bit lines are connected to the output terminals of a memory cell or logic circuit controlled by a selection signal, the control signal of the first amplifier is generated by an activation circuit responsive to a reading signal, said activation circuit furnishing the control signal a predetermined period of time after the appearance of the selection signal for selection of the memory cell or logic circuit.

6. A device according to claim 5, wherein the signal for selection of the memory cell or logic circuit is synchronized by a clock signal, and the activation circuit comprises a circuit functioning as an AND gate and having two inputs receiving the reading signal and a clock signal and an output of the AND gate being connected to a gate of an n-channel field-effect transistor, a source of which is connected to the supply terminal having the lowest potential and a drain of which transistor is connected to an input of a multivibrator comprising two inverters connected in a mutual input-to-output relationship, an output of said multivibrator furnishing the control signal of the first amplifier.

7. A device according to claim 6, wherein the input of the multivibrator is likewise connected to a drain of a p-channel field-effect transistor, a source of which is connected to the supply terminal having the highest potential, and a gate of which transistor is connected to receive a complement of a second clock signal.

8. A device according to claim 7, wherein the input of the multivibrator is connected to a drain of at least one other n-channel field-effect transistor, a source of which is connected to the supply terminal having the lowest potential and a gate of which transistor receives a transfer control signal which, when it is active, permits the activation of the first amplifier independently of the reading signal.

9. A device according to claim 7 including a precharging device for charging the bit lines to a predetermined voltage, and the precharging device being activated if the control signal of the first amplifier is inactive and if the second clock signal is active.

10. A device according to claim 9, wherein that the precharging circuit includes two p-channel field-effect transistors each having a source connected to the supply terminal having the highest potential, and drains of which transistors are connected, respectively, to the two bit lines a third p-channel field-effect transistor having current electrodes connected to the two bit lines, the gates of said p-channel transistors receiving a precharging control signal emitted by a precharging control device.

11. A device according to claim 2, wherein the bit lines are connected to the output terminals of a memory cell or logic circuit controlled by a selection signal, the control signal of the first amplifier is generated by an activation circuit responsive to a reading signal, said activation circuit furnishing the control signal a predetermined period of time after the appearance of the selection signal for selection of the memory cell or logic circuit.

12. A device according to claim 11, wherein the signal for selection of the memory cell or logic circuit is synchronized by a clock signal, and the activation circuit comprises a circuit functioning as an AND gate and having two inputs receiving the reading signal and a clock signal, and an output of the AND gate being connected to a gate of an n-channel field-effect transistor, a source of which is connected to the supply terminal having the lowest potential and a drain of which transistor is connected to an input of a multivibrator comprising two inverters connected in a mutual input-to-output relationship, an output of said multivibrator furnishing the control signal of the first amplifier.

13. A device according to claim 21, wherein the input of the multivibrator is likewise connected to a drain of a p-channel field-effect transistor, a source of which is connected to the supply terminal having the highest potential and a gate of which transistor is connected to receive a complement of a second clock signal.

14. A device according to claim 13, wherein the input of the multivibrator is connected to a drain of at least one other n-channel field-effect transistor, a source of which is connected to the supply terminal having the lowest potential and a gate of which transistor receives a transfer control signal which, when it is active, permits the activation of the first amplifier independently of the reading signal.

15. A device according to claim 3, wherein the bit lines are connected to the output terminals of a memory cell or logic circuit controlled by a selection signal, the control signal of the first amplifier is generated by an activation circuit furnishing the control signal a predetermined period of time after the appearance of the selection signal for selection of the memory cell or logic circuit.

16. A device according to claim 15, wherein the signal for selection of the memory cell or logic circuit is synchronized by a clock signal, and the activation circuit comprises a circuit functioning as an AND gate and having two inputs receiving the reading signal and a clock signal and an output of the AND gate being connected to a gate of an n-channel field-effect transistor, a source of which is connected to the supply terminal having the lowest potential and a drain of which transistor is connected to an input of a multivibrator comprising two inverters connected in parallel input-to-output relationship, an output of said multivibrator furnishing the control signal of the first amplifier.

17. A device according to claim 16, wherein the input of the multivibrator is likewise connected to a drain of a p-channel field-effect transistor, a source of which is connected to the supply terminal having the highest potential and a gate of which transistor is connected to receive a complement of a second clock signal.

18. A device according to claim 17, wherein the input of the multivibrator is connected to a drain of at least one other n-channel field-effect transistor, a source of which is connected to the supply terminal having the lowest potential and a gate of which transistor receives a transfer control signal which, when it is active, permits the activation of the first amplifier independently of the reading signal.

19. A device according to claim 17, including a precharging device for charging the bit lines to a predetermined voltage, and the precharging device being activated if the control signal of the first amplifier is inactive and if the second clock signal is active.

20. A device for amplifying the voltage difference between two bit lines, said device being connectable to receive a source of supply voltage and including a first amplifier responsive to the voltages of said bit lines and which, when it is activated by a control signal, couples the bit line having the highest voltage to a terminal of the voltage source having the highest potential of said voltage source, said device including a detection circuit connected to the bit lines and furnishing an output signal when the voltage of one of the bit lines is greater than a predetermined value, and said output signal controls the activation of a second amplifier responsive to said voltages and which, when it is activated couples the bit line having the lowest voltage to another terminal having the lowest potential of said voltage source.

* * * * *

UNITED STATES PATENT AND TRADEMARK OFFICE
CERTIFICATE OF CORRECTION

PATENT NO. : 4,810,910

DATED : March 7, 1989

INVENTOR(S) : Jean Pierre Schoellkopf et al

It is certified that error appears in the above-identified patent and that said Letters Patent is hereby corrected as shown below:

Claim 13, Line 1, "21" should be --12--.

Signed and Sealed this

Seventh Day of November, 1989

*Attest:*

JEFFREY M. SAMUELS

*Attesting Officer*       *Acting Commissioner of Patents and Trademarks*

UNITED STATES PATENT AND TRADEMARK OFFICE
CERTIFICATE OF CORRECTION

PATENT NO. : 4,810,910

DATED : March 7, 1989

INVENTOR(S) : Schoellkopf et al

It is certified that error appears in the above-identified patent and that said Letters Patent is hereby corrected as shown below:

On the title page, item [75], "Schoellikopf" should be --Schoellkopf--.

Signed and Sealed this

Twentieth Day of February, 1990

Attest:

JEFFREY M. SAMUELS

Attesting Officer     Acting Commissioner of Patents and Trademarks